(12) United States Patent
Tsukamoto

(10) Patent No.: US 9,017,524 B2
(45) Date of Patent: Apr. 28, 2015

(54) VACUUM FILM FORMATION METHOD FOR INORGANIC LAYER, BARRIER LAMINATE, DEVICE, AND OPTICAL COMPONENT

(75) Inventor: Naoki Tsukamoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 728 days.

(21) Appl. No.: 12/404,761

(22) Filed: Mar. 16, 2009

(65) Prior Publication Data

US 2009/0233108 A1  Sep. 17, 2009

(30) Foreign Application Priority Data

Mar. 17, 2008  (JP) ................. 2008-067542

(51) Int. Cl.
*C23C 14/56* (2006.01)
*C23C 14/06* (2006.01)
*C23C 14/08* (2006.01)
*H01L 51/52* (2006.01)

(52) U.S. Cl.
CPC ........... *C23C 14/566* (2013.01); *C23C 14/0652* (2013.01); *C23C 14/081* (2013.01); *H01L 51/5237* (2013.01)

(58) Field of Classification Search
CPC .... C23C 14/56; C23C 14/564; C23C 14/566; C23C 14/568; C23C 14/081; C23C 14/0652; H01J 37/3497; H01L 51/5237
USPC ............. 204/298.25, 192.12, 192.15, 192.16, 204/192.23; 118/718, 719
See application file for complete search history.

(56) References Cited

U.S. PATENT DOCUMENTS

| | | | | |
|---|---|---|---|---|
| 4,680,742 A * | 7/1987 | Yamada et al. | ............. | 369/13.35 |
| 5,089,375 A * | 2/1992 | Gotoh et al. | ................ | 430/271.1 |
| 5,205,918 A * | 4/1993 | Kinokiri et al. | .......... | 204/298.07 |
| 5,382,126 A * | 1/1995 | Hartig et al. | .................. | 414/217 |
| 5,482,607 A * | 1/1996 | Hashimoto et al. | ....... | 204/298.25 |
| 7,605,394 B2 * | 10/2009 | Marks et al. | .................... | 257/40 |
| 2001/0015019 A1 | 8/2001 | Miyakawa et al. | | |
| 2005/0095422 A1 * | 5/2005 | Sager et al. | ................... | 428/336 |

FOREIGN PATENT DOCUMENTS

| | | |
|---|---|---|
| JP | 63-121664 A | 5/1988 |
| JP | 10-270527 A | 10/1998 |
| JP | 2001-235277 A | 8/2001 |

(Continued)

OTHER PUBLICATIONS

Japanese Office Action for Application No. 2008-067542 dated Oct. 4, 2011 (with English translation).

(Continued)

*Primary Examiner* — Rodney McDonald
(74) *Attorney, Agent, or Firm* — Birch, Stewart, Kolasch & Birch, LLP

(57) ABSTRACT

A vacuum film formation method for forming at least one inorganic layer on a support, which comprise transporting a support of which the area of the surface to be coated with an inorganic layer formed thereon is a (unit: cm$^2$) into a first vacuum tank having a capacity of at most 100a (unit: cm$^3$) under atmospheric pressure, degassing the first vacuum tank into a vacuum, transporting the support from the first vacuum tank to a second vacuum tank while the vacuum condition is kept as such, and forming at least one inorganic layer on the support in the second vacuum tank.

13 Claims, 2 Drawing Sheets

(56) References Cited

FOREIGN PATENT DOCUMENTS

| JP | 2002-158273 A | 5/2002 |
|----|---------------|--------|
| JP | 2004-322565 A | 11/2004 |
| JP | 2005-169995 A | 6/2005 |
| JP | 2007-30387 A | 2/2007 |

OTHER PUBLICATIONS

Japanese Office Action, dated Jul. 3, 2012, issued in corresponding Japanese Patent Application No. 2008-067542.

* cited by examiner

VACUUM FILM FORMATION METHOD FOR INORGANIC LAYER, BARRIER LAMINATE, DEVICE, AND OPTICAL COMPONENT

BACKGROUND OF THE INVENTION

1. Field of the Invention

The present invention relates to a method for forming at least one inorganic layer on a support. The invention also relates -to a barrier laminate having an excellent barrier property, to a device and an optical component comprising the barrier laminate.

2. Description of the Related Art

Recently, in the field of liquid-crystal display devices, organic EL devices (organic electroluminescent devices) and the like, plastic film substrates have become used in place of heavy and crackable glass substrates, as being advantageous in that they are lightweight and are hardly crackable and, in addition, they are flexible. However, as compared with glass substrates, plastic film substrates are problematic in that their water-vapor barrier property is poor. When a substrate having a poor water-vapor barrier property is used in liquid-crystal display devices or organic EL devices, the devices may have display defects owing to water vapor penetration into the liquid-crystal cell, etc.

Accordingly, for enhancing the barrier property of plastic film substrates, widely employed is a technique of forming an inorganic layer having a barrier property on a plastic film support. For example, there are known a plastic film support coated with silicon oxide through vapor deposition thereon (for example, see JP-B 53-12953 (pp. 1-3)), and a plastic film support coated with aluminum oxide through vapor deposition thereon (for example, see JP-A 58-217344 (pp. 1-4)). In addition, also known is a plastic film support coated with silicon oxide, aluminum oxide or indium/tin composite oxide according to a sputtering method; and the best one of the type exhibits a barrier property of 0.011 $g/m^2$/day/inorganic layer (for example, see JP-A 2002-264274 (p. 4)).

In forming an inorganic layer on a support under a vacuum condition as in a sputtering method, the support must be conveyed and processed in order in plural closed chambers. For example, JP-A 2001-335916 (FIG. 2) describes a process of treating a support by conveying it in order in a load-locking chamber, a degassing chamber, an inorganic layer forming chamber and an unloading chamber all having nearly the same capacity.

SUMMARY OF THE INVENTION

However, the barrier property of the inorganic layer formed in such a conventional apparatus is insufficient, and a film formation technique is desired capable of forming an inorganic layer having a good barrier property necessary for liquid-crystal display devices and organic EL devices, according to a simplified method.

Taking the above-mentioned prior art problems into consideration, the present inventors have made further investigations for the purpose of forming an inorganic layer having a better barrier property according to a more simplified method than conventionally. The inventors have made still further investigations for the purpose of providing a laminate having a better laminate property according to the production method, and providing a device and an optical component having excellent durability.

The inventors have assiduously studied for attaining the above-mentioned objects and, as a result, have found that an inorganic layer having an excellent barrier property can be formed in a mode of vacuum film formation by controlling the relation between the area of the support on which the inorganic layer is to be formed and the capacity of the load-locking chamber to be used in vacuum film formation, and have succeeded in solving the prior-art problems. As a result, the inventors have provided the invention described below.

[1] A vacuum film formation method for forming at least one inorganic layer on a support, which comprises:
transporting a support of which the area of the surface to be coated with an inorganic layer formed thereon is a (unit: $cm^2$) into a first vacuum tank having a capacity of at most 100a (unit: $cm^3$) under atmospheric pressure,
degassing the first vacuum tank into a vacuum,
transporting the support from the first vacuum tank to a second vacuum tank while the vacuum condition is kept as such, and
forming at least one inorganic layer on the support in the second vacuum tank.

[2] The vacuum film formation method for forming an inorganic layer of [1], wherein the closed capacity of the first vacuum tank is at most 30 a (unit: $cm^3$)

[3] The vacuum film formation method for forming an inorganic layer of [1], wherein the closed capacity of the first vacuum tank is at most 10 a (unit: $cm^3$).

[4] The vacuum film formation method for forming an inorganic layer of any one of [1] to [3], wherein the first vacuum tank and the second vacuum tank directly communicate with each other.

[5] The vacuum film formation method for forming an inorganic layer of any one of [1] to [3], wherein the first vacuum tank communicates with the second vacuum tank via a vacuum chamber, and the support is transported from the first vacuum tank to the second vacuum tank via the vacuum chamber while kept under the vacuum condition.

[6] The vacuum film formation method for forming an inorganic layer of any one of [1] to [5], wherein the step of transporting the support from the m'th vacuum tank to the (m+1)'th vacuum tank while kept under the vacuum condition is carried out in order until m reaches n in which m starts from 1 and n is an integer of 2 or more.

[7] The vacuum film formation method for forming an inorganic layer of [6], wherein the n's vacuum tanks all communicate with one vacuum chamber, and when the support is transported between the vacuum tanks, it passes though the vacuum chamber by all means.

[8] The vacuum film formation method for forming an inorganic layer of any one of [1] to [7], wherein the inorganic layer is formed according to a reactive sputtering method.

[9] The vacuum film formation method for forming an inorganic layer of [8], wherein the inorganic layer is an $Si_3N_4$ layer or an $Al_2O_3$ layer.

[10] The vacuum film formation method for forming an inorganic layer of any one of [1] to [7], wherein the inorganic layer is formed according to a CVD method.

[11] The vacuum film formation method for forming an inorganic layer of [10], wherein the inorganic layer is an $Si_3N_4$ layer.

[12] The vacuum film formation method for forming an inorganic layer of any one of [1] to [11], wherein the support is a plastic film.

[13] The vacuum film formation method for forming an inorganic layer of any one of [1] to [12], wherein the support to be transported into the first vacuum tank is a support having an organic layer formed on its surface, and the inorganic layer is formed on the organic layer.

[14] A barrier laminate having an inorganic layer formed according to the vacuum film formation method of any one of [1] to [13].
[15] A device comprising the barrier laminate of [14].
[16] A device comprising the barrier laminate of [14] as a sealant film.
[17] The device of [15] or [16], which is an organic EL device.
[18] An optical component comprising the barrier laminate of [14].

According to the vacuum film formation method for forming an inorganic layer of the invention, an inorganic layer having an excellent barrier property can be formed in a simplified manner. The barrier laminate produced according to the vacuum film formation method of the invention has a better barrier property than that of barrier laminates produced according to conventional methods, and the device and the optical component comprising the laminate have excellent durability.

Figure 1:
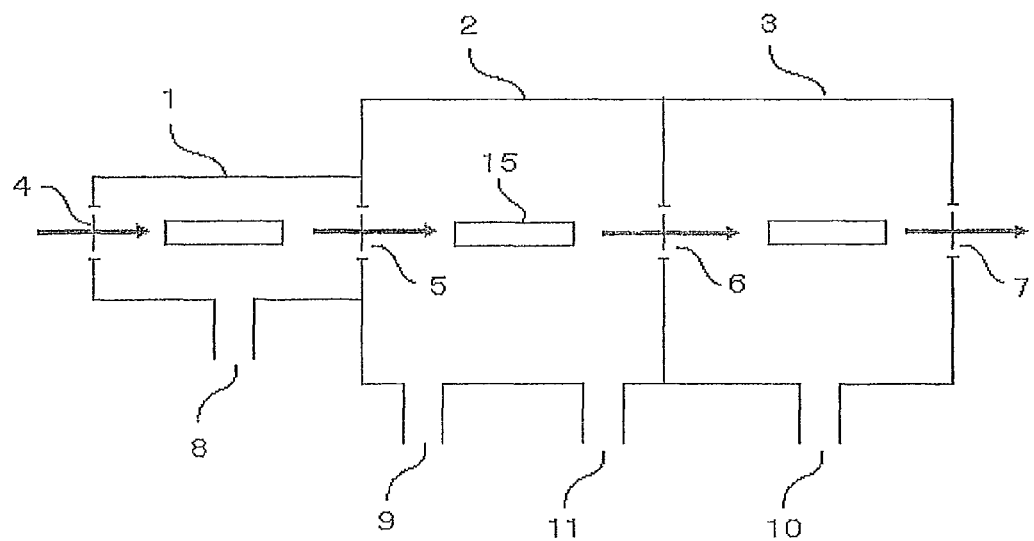
FIG. 1 is an outline view showing a constitution example of a vacuum film formation apparatus for use in the invention.

In the figures, 1 is first vacuum tank, 2 is second vacuum tank, 3 is third vacuum tank, 4 to 7 are gate valves, 8 to 10 are exhaust ports, 11 is starting material gas introduction port, 15 is support, 21 is first vacuum tank, 22 is second vacuum tank, 23 is third vacuum tank, 24 is vacuum chamber, 25 to 29 are gate valves, 31 to 34 are exhaust ports, and 35 is starting material gas introduction port.

BEST MODE FOR CARRYING OUT THE INVENTION

The contents of the invention are described in detail hereinunder. The description of the constitutive elements of the invention given hereinunder is for some typical embodiments of the invention, to which, however, the invention should not be limited. In this description, the numerical range expressed by the wording "a number to another number" means the range that falls between the former number indicating the lowermost limit of the range and the latter number indicating the uppermost limit thereof.

<Support>

The support is the base of the barrier laminate of the invention, on which at least one inorganic layer are formed.

In the barrier laminate of the invention, the support is preferably a plastic film. Not specifically defined in point of the material and the thickness thereof, the plastic film usable in the invention may be any one capable of supporting the laminate of the organic layer and the inorganic layer formed on its surface; and it may be suitably selected depending on the use and the object thereof. Concretely, the plastic film includes thermoplastic resins such as polyester resin, methacryl resin, methacrylic acid-maleic anhydride copolymer, polystyrene resin, transparent fluororesin, polyimide resin, fluoropolyimide resin, polyamide resin, polyamidimide resin, polyetherimide resin, cellulose acylate resin, polyurethane resin, polyether ether ketone resin, polycarbonate resin, alicyclic polyolefin resin, polyarylate resin, polyether sulfone resin, polysulfone resin, cycloolefin copolymer, fluorene ring-modified polycarbonate resin, alicyclic-modified polycarbonate resin, fluorene ring-modified polyester resin, acryloyl compound, etc.

When the barrier laminate of the invention must be resistant to heat, then the support must also be resistant to heat. For example, in case where the barrier laminate of the invention is used as a substrate of a device such as an organic EL device to be mentioned hereinunder, it is desirable that the support is formed of a heat-resistant material. Concretely, the support is preferably formed of a heat-resistant transparent material having a glass transition temperature (Tg) of not lower than 100° C. and/or a linear thermal expansion coefficient of at most 40 ppm/° C. For example, the material is a thermoplastic resin preferably having, as the constitutive simple polymer thereof, Tg of from 70° C. to 350° C., more preferably not lower than 120° C. The thermoplastic resin of the type includes, for example, polyethylene naphthalate (PEN: 120° C.), polycarbonate (PC: 140° C.), alicyclic polyolefin (e.g., Nippon Zeon's Zeonoa 1600: 160° C.), polyarylate (PAr: 210° C.), polyether sulfone (PES: 220° C.), polysulfone (PSF: 190° C.), cycloolefin copolymer (COC, compound described in JP-A2001-150584: 162° C.), polyimide (e.g., Mitsubishi Gas Chemical's Neoprim: 260° C.), fluorene ring-modified polycarbonate (BCF-PC, compound described in JP-A 2000-227603: 225° C.), alicyclic-modified polycarbonate (IP-PC, compound described in JP-A 2000-227603: 205° C.), acryloyl compound (compound described in JP-A 2002-80616: 300° C. or more) (the parenthesized data are Tg). In particular, for high transparency, use of alicyclic polyolefin and the like is preferred. Tg and the linear expansion coefficient may be controlled by the additives to the material.

As the support of the barrier laminate of the invention, also usable is a thermosetting resin. The thermosetting resin includes an epoxy resin and a radiation-curable resin. The epoxy resin includes polyphenol-type, bisphenol-type, halogenobisphenol-type and novolak-type resins. Any known curing agent may be used for curing the epoxy resin. For example, the usable curing agent includes amines, polyaminoamides, acids, acid anhydrides, imidazoles, mercaptans, phenol resins, etc. Above all, from the viewpoint of the solvent resistance, the optical properties and the thermal properties of the cured resins, preferred are acid anhydrides or acid anhydride structure-having polymers or aliphatic amines; and more preferred are acid anhydrides and acid anhydride structure-having polymers. Also preferably, a suitable amount of a curing catalyst of a known tertiary amines, imidazoles and the like may be added to the resin.

In case where the barrier laminate of the invention is combined with a polarizer in its use, it is desirable that the barrier layer side (on which a laminate containing at least one inorganic layer and at least one organic layer is formed) of the barrier laminate faces the inside of the cell, and is disposed in the innermost site (adjacent to the device). In this case, the barrier laminate is disposed more inside the cell than the polarizer, and therefore the retardation of the barrier laminate is an important factor. In case where the barrier laminate is used in the manner as above, preferred is any of the following embodiments: The barrier laminate comprising a support having a retardation of at most 10 nm is laminated with a circular polarizer (¼ wavelength plate+(½ wavelength plate)+linear polarizer); or the barrier laminate comprising a support having a retardation of from 100 nm to 180 nm, which is usable as a ¼ wavelength plate, is combined with a linear polarizer.

The support having a retardation of at most 10 nm includes cellulose triacetate (FUJIFILM's Fujitac), polycarbonate (Teijin Chemical's Pureace, Kaneka's Elmec), cycloolefin copolymer (JSR's Arton, Nippon Zeon's Zeonoa), cycloolefin copolymer (Mitsui Chemical's Apel (pellets), Polyplastic's Topas (pellets)), polyarylate (Unitika's U100 (pellets)), transparent polyimide (Mitsubishi Gas Chemical's Neoprim), etc. As the ¼ wavelength plate, usable is a film produced by suitably stretching the above-mentioned film to have a desired retardation.

In case where the barrier laminate of the invention is used in a device such as an organic EL device, its support is preferably transparent. In such applications that require transparency, the light transmittance of the support is preferably at least 80%, morepreferably at least 85%, even more preferably at least 90%. The light transmittance may be measured according to the method described in JIS-K7105. Concretely, using an integrating sphere-type light transmittance meter, a whole light transmittance and a quantity of scattered light are measured, and the diffusive transmittance is subtracted from the whole transmittance to obtain the intended light transmittance of the sample.

Even when the barrier laminate of the invention is used in displays, it does not always require transparency in a case where it is not disposed on the viewers' side. Accordingly in such a case, a nontransparent material may be used for the support. The nontransparent material includes, for example, polyimide, polyacrylonitrile, known liquid-crystal polymer.

Not specifically defined, the thickness of the support for use in the barrier laminate of the invention may be suitably selected depending on its use. In case where the above-mentioned plastic film or the like is used as the support, its thickness may be typically from 1 to 800 µm, preferably from 10 to 200 µm. The support may have a functional layer such as a transparent conductive layer, a primer layer, etc. Furthermore, the support may preferably have the layer described in [0036] to [0038] of JP-A 2006-289627.

In the invention, a device such as an organic EL device or an optical component may be selected as the support. In particular, when a device or an optical component that requires sealing is selected as the support and when at least one organic layer and at least one inorganic layer are formed thereon according to the production method of the invention, then the device or the optical component may be effectively sealed up. The details of the device and the optical component are described below.

<Organic Layer>

The vacuum film formation method for an inorganic layer of the invention is a method of vacuum film formation for forming an inorganic layer on a support, in which, preferably, an organic layer is formed on the support before the inorganic layer is formed through vacuum film formation thereon. The organic layer may be formed on the inorganic layer formed according to the invention.

The organic layer is generally a layer of a polymer. Concretely, it is preferably a layer of a thermoplastic resin such as polyester, methacryl resin, methacrylic acid-maleic anhydride copolymer, polystyrene, transparent fluororesin, polyimide, fluoropolyimide, polyamide, polyamidimide, polyetherimide, cellulose acylate, polyurethane, polyether ether ketone, polycarbonate, alicyclic polyolefin, polyarylate, polyether sulfone, polysulfone, fluorene ring-modified polycarbonate, alicyclic-modified polycarbonate, fluorene ring-modified polyester, acryloyl compound; or silicon containing polymer such as polysiloxane.

Two or more organic sublayers may be laminated. In this case, the constitutive layers may have the same composition or may have -different compositions. The boundary between the organic layer and the inorganic layer may be unclear and the composition may continuously change in the thickness direction as shown in US 2004/46497.

Preferably, the organic layer in the invention is formed by applying a polymer precursor (e.g., monomer) capable of forming a polymer through polymerization. Preferred monomers for use in the invention are acrylate and methacrylate. Preferred examples of acrylate and methacrylate are, for example, compounds described in U.S. Pat. Nos. 6,083,628 and 6,214,422.

Concrete examples of acrylate and methacrylate preferred for use in the invention are shown below, to which, however, the monomers usable in the invention are not limited.

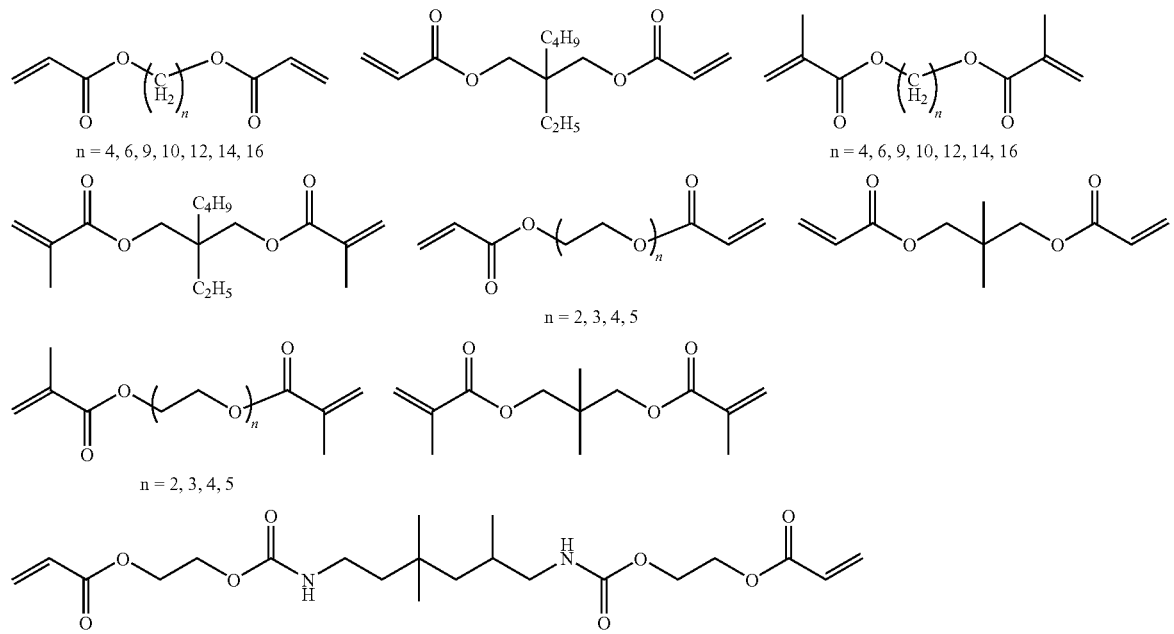

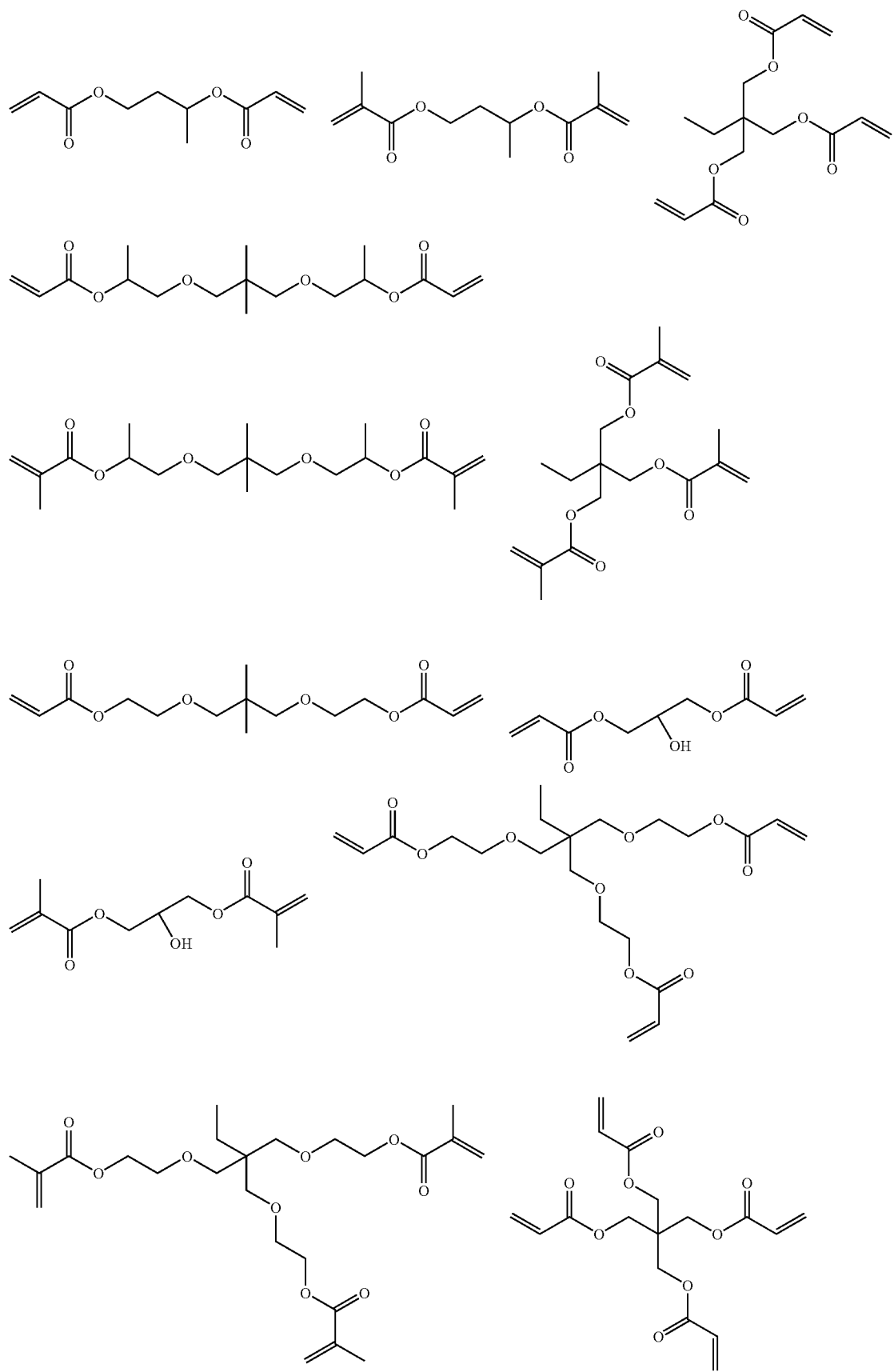

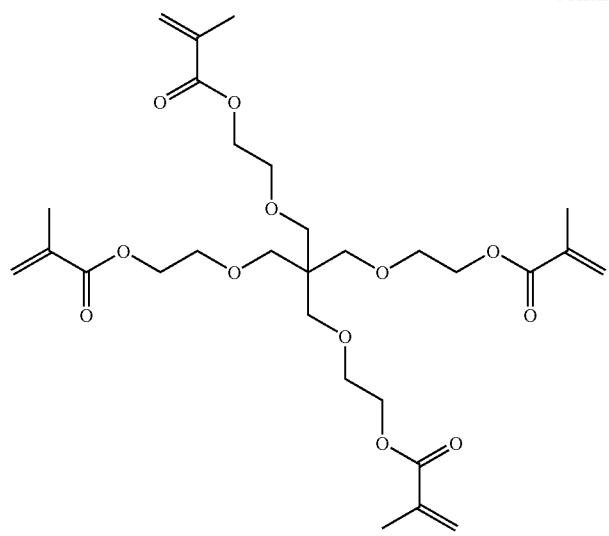
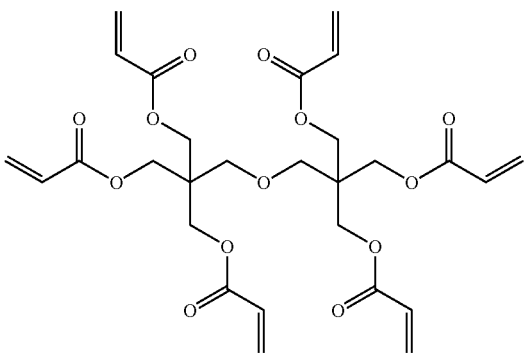
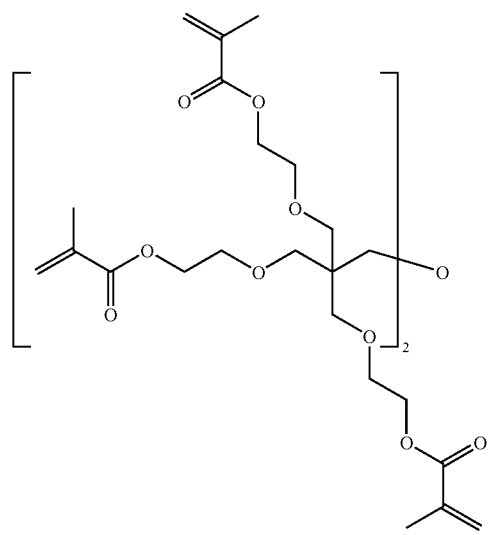
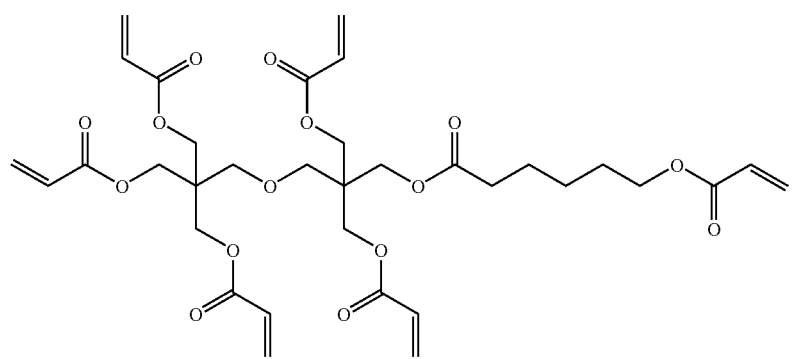

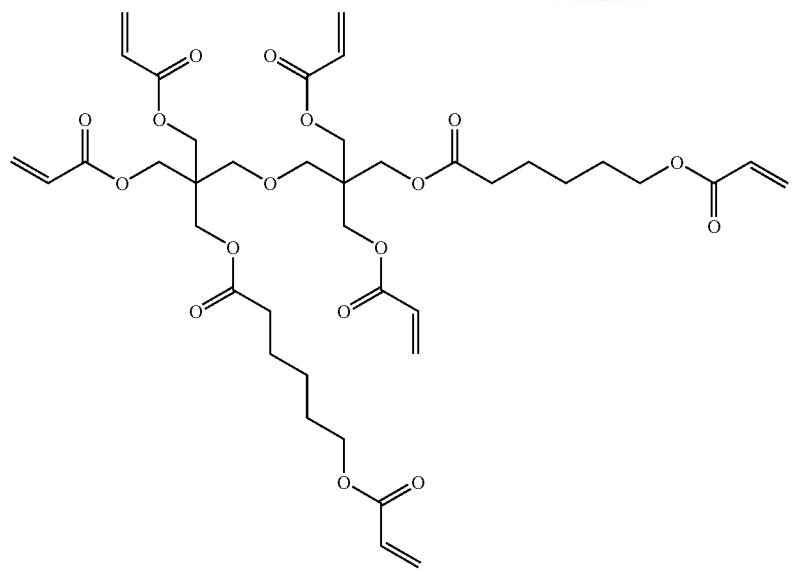
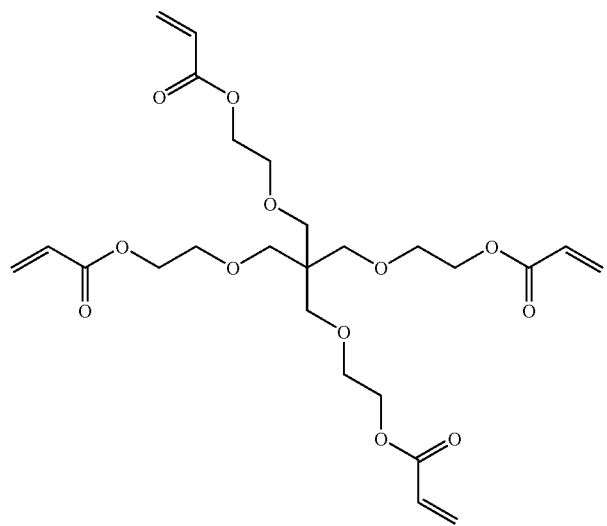
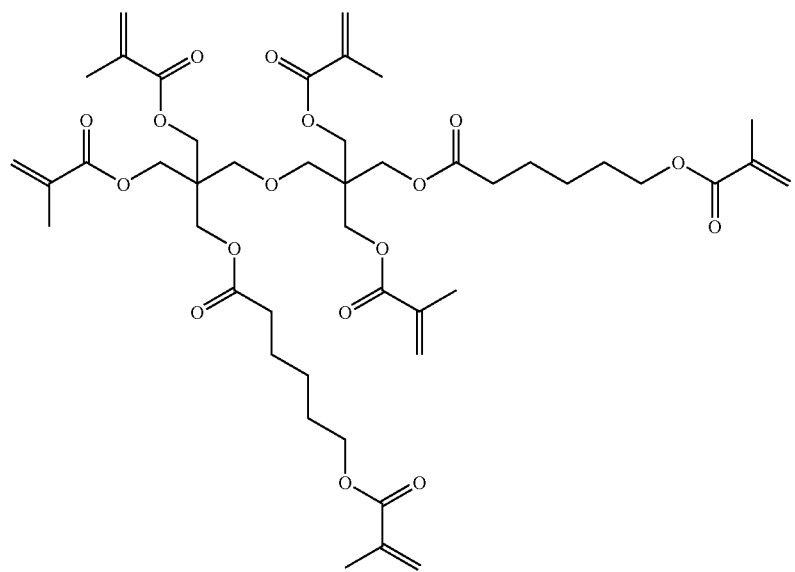

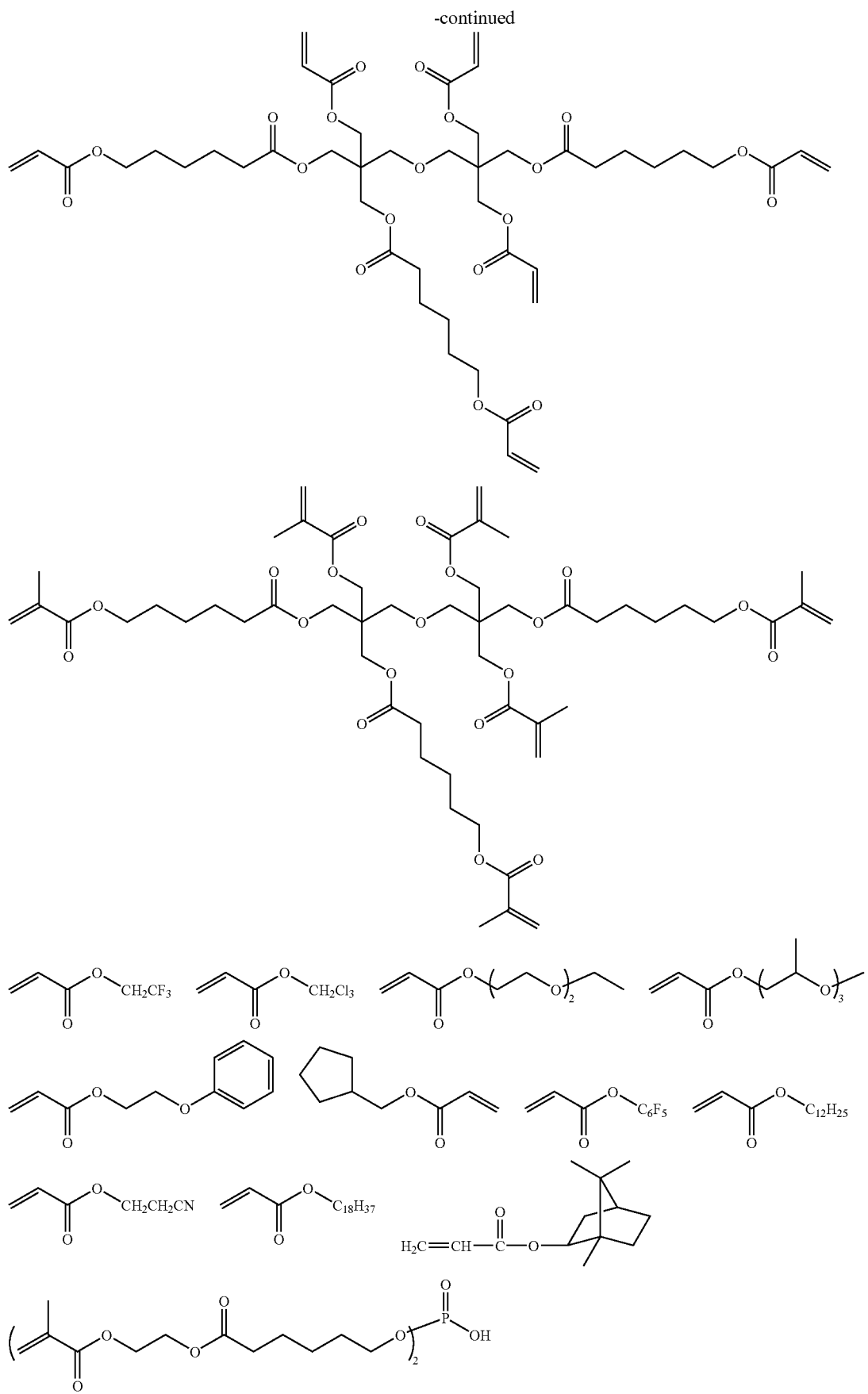

-continued

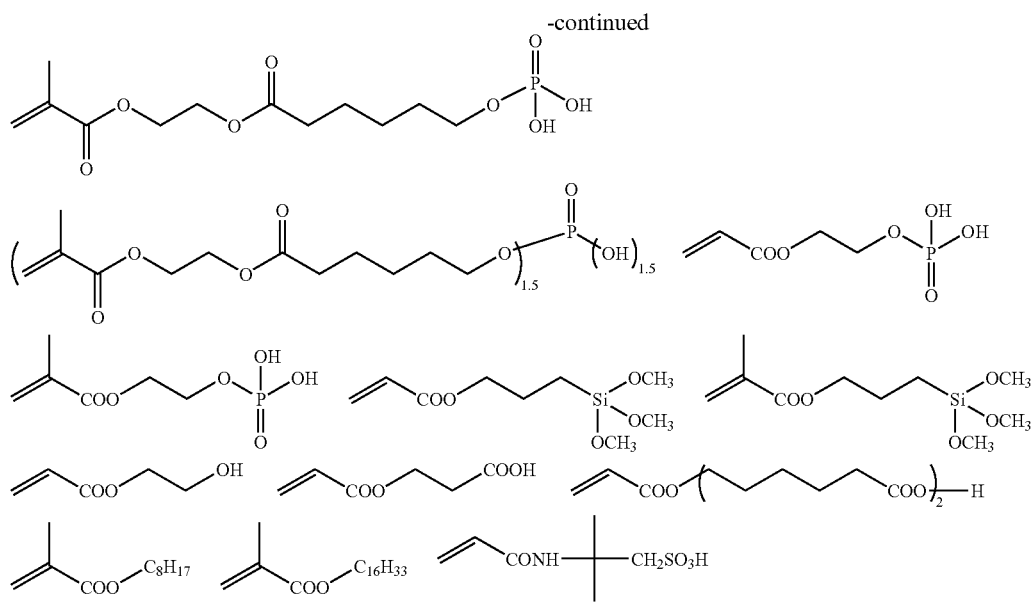

For forming the organic layer, employable is an ordinary solution coating method. The solution coating method includes, for example, a dip coating method, an air knife coating method, a curtain coating method, a roller coating method, a wire bar coating method, a gravure coating method, a slide coating method, or an extrusion coating method where a hopper is used as in U.S. Pat. No. 2,681,294.

The monomer polymerization method is not specifically defined, for which, however, preferably used is thermal polymerization, light (UV, visible light) polymerization, electron beam polymerization, plasma polymerization, or their combination. Of those, especially preferred is photopolymerization. In photopolymerization, a photopolymerization initiator may be used. Examples of the photopolymerization initiator are Ciba Speciality Chemicals' commercial products, Irgacure series (e.g., Irgacure 651, Irgacure 754, Irgacure 184, Irgacure 2959, Irgacure 907, Irgacure 369, Irgacure 379, Irgacure 819), Darocure series (e.g., Darocure TPO, Darocure 1173), Quantacure PDO; and Lamberti's commercial products, Esacure series (e.g., Esacure TZM, Esacure TZT, Esacure KTO 46) and also oligomer-type Esacure KIP series, etc.

The light for irradiation is generally UV light from high-pressure mercury lamp or low-pressure mercury lamp. The irradiation energy is preferably at least 0.1 J/cm$^2$, more preferably at least 0.5 J/cm$^2$. Acrylates and methacrylates receive polymerization inhibition by oxygen in air, and therefore the oxygen concentration or the oxygen partial pressure during polymerization is preferably low. The method includes, for example, an inert gas purging method (nitrogen purging method, argon purging method, etc.), or a reduced-pressure method. Of those, a reduced-pressure curing method is more preferred as having the advantage of lowering the dissolved oxygen concentration in monomer.

In case where the oxygen concentration in polymerization is lowered according to a nitrogen purging method, the oxygen concentration is preferably at most 2%, more preferably at most 0.5%. In case where the oxygen partial pressure is lowered according to a pressure reduction method, the total pressure is preferably at most 1000 Pa, more preferably at most 100 Pa. Especially preferred is UV polymerization with irradiation at 0.5 J/cm$^2$ or more under a reduced pressure condition of at most 100 Pa. Most preferably, the monomer film formed according to a flash vapor deposition method is UV-polymerized with irradiation at an energy of at least 0.5 J/cm$^2$ under a reduced pressure condition. The method increases the degree of polymerization to give an organic layer having a high hardness. Preferably, after a monomer mixture is applied to or vapor-deposited in an intended site, the monomer is polymerized. In monomer polymerization to form an organic layer, preferably, the polymerizable group (e.g., ethylenic double bond) in the organic coupling agent is also polymerized.

In the invention, preferably, the coating liquid for organic layer is cured as soon as possible after its application, and more preferably, it is cured just after its application. Just after its application as referred to herein means that the step comprises immediately starting the polymerization just after the coating step for the organic layer. Specifically, not having an operation of contacting something to the surface of the organic layer formed by coating, the organic layer is cured directly as it is. Curing the layer not taking so much time after the end of its coating may improve the surface roughness of the organic layer.

Preferably, the conversion of monomer is at least 85%, more preferably at least 88%, even more preferably at least 90%, still more preferably at least 92%. The conversion as referred to herein means the ratio of the reacted polymerizable groups to all the polymerizable groups (acryloyl group and methacryloyl group) in the monomer mixture. The conversion may be determined through IR absorptiometry.

The organic layer may be formed according to a sputtering method. In the sputtering method, any solid organic material may be used with no limitation to form the organic layer.

The thickness of the organic layer is not specifically defined, but is preferably from 50 nm to 2000 nm, more preferably from 200 nm to 1500 nm. When the thickness is at least 50 nm, then the layer may have few defects and the barrier property thereof may be favorably bettered; and when it is at most 1500 nm, then it is also favorable since the layer may not be cracked by external force and its barrier property may not be worsened.

Two or more organic layers may be laminated. In this case, the constitutive layers may have the same composition or may differ in point of the composition thereof. In case where two or more layers are laminated, preferably they are so planned that each falls within the above-mentioned preferred range. In the laminate of the invention, the interface between the inorganic layer and the organic layer may be indefinite and a layer of which the composition changes continuously in the thickness direction thereof may exist in the interface, as in US Laid-Open 2004-46497.

<Inorganic Layer>

In the invention, at least one inorganic layer is formed in vacuum. Concretely, a support of which the area of the surface to be coated with an inorganic layer formed thereon is a (unit: $cm^2$) is transported into a first vacuum tank having a capacity of at most 100 a (unit: $cm^3$) under atmospheric pressure, the first vacuum tank is degassed into a vacuum, the support is transported from the first vacuum tank to a second vacuum tank while the vacuum condition is kept as such, and at least one inorganic layer is formed on the support in the second vacuum tank.

The area of the surface on which an inorganic layer is to be formed means the area a of the surface of the support on which an inorganic layer is formed in the second vacuum tank. When the support is tabular, in general, this corresponds to the area of one surface of the tabular support. The absolute value of the area a is not specifically defined, but is generally from 25 to 62500 $cm^2$, preferably from 50 to 10000 $cm^2$, more preferably from 100 to 900 $cm^2$.

The capacity of the first vacuum tank means the inner capacity of the first vacuum tank kept closed up. The inner capacity of the first vacuum tank is generally from 100 to 6250000 $cm^3$, preferably from 100 to 300000 $cm^3$, more preferably from 100 to 9000 $cm^3$.

According to the vacuum film formation method for an inorganic layer of the invention, used is a first vacuum tank having a capacity of at most 100 a (unit: $cm^3$) when the area of the surface of the support on which the inorganic layer is to be formed is a (unit: $cm^2$). Preferably, the capacity of the first vacuum tank is at most 30 a, more preferably at most 10 a. Using the first vacuum tank having the capacity in forming the inorganic layer can ext-remely-enhance the barrier property of the inorganic layer formed. In JP-A 2002-264274, the best value of the water vapor permeability per one inorganic layer is 0.011 $g/m^2/day$. On the other hand, in film formation with the first vacuum tank having a capacity of at most 100 a in the invention, an inorganic layer having a water vapor permeability of smaller than 0.011 $g/m^2/day$ can be formed. Using the first vacuum tank having a capacity of at most 30 a further lowers the water vapor permeability of the layer formed; and using the first vacuum tank having a capacity of at most 10 a still further lowers the water vapor permeability of the layer formed.

In the vacuum film formation method for an inorganic layer in the invention, a support is transported into the first vacuum tank under atmospheric pressure. The support as referred to herein may be one having the above-mentioned organic layer formed thereon. The first vacuum tank in which the support has been transported is degassed into a vacuum. For the degassing, usable is any ordinary degassing method, for which, for example, suitably selected and employed is a rotary pump, a turbo pump, a cryopump or the like. More preferably, the pumps are combined and used. The reduced pressure is may be generally from $10^3$ to $10^{-7}$ Pa, preferably from $10^2$ to $10^{-5}$ Pa, more preferably from $10^1$ to $10^{-4}$ Pa.

The support kept in vacuum in the first vacuum tank is then transported from the first vacuum tank from the second vacuum tank while still kept in vacuum. In this stage, the line through which the support is transported is all in vacuum. Specifically, the transporting line and the second vacuum tank must be previously kept in vacuum. In this stage, the pressure in the transporting line and the second vacuum tank is not always required to be closely the same as the pressure in the first vacuum tank. Preferably, however, the pressure in the first vacuum tank, the transporting line and the second vacuum tank is the same.

The positional relationship and the connecting mode between the first vacuum tank and the second vacuum tank are not specifically defined. Preferably, the first vacuum tank and the second vacuum tank are directly connected to each other, and the outlet port of the first vacuum tank serves also as the inlet port of the second vacuum tank. Employing this embodiment saves the apparatus space and enhances the efficiency in forming the inorganic layer. In another preferred embodiment, the first vacuum tank is connected to the second vacuum tank via a vacuum chamber put therebetween. In this case, the support is, after once transported from the first vacuum tank to the vacuum chamber, then further transported from the vacuum chamber to the second vacuum tank. When the support is transported from the first vacuum tank to the vacuum chamber, preferably, the partition between the vacuum chamber and the second vacuum tank is closed. Employing the embodiment may reduce the risk of carryover of the impurities and dust to be carried over by the support into the first vacuum tank to run into it, into the second vacuum tank.

After the support is transported into the second vacuum tank, the second vacuum tank is closed, and in the second vacuum tank, at least one inorganic layer is formed on the support. For the film formation, an ordinary inorganic vacuum film formation method may be employed. For example, employable is a reactive sputtering method, a CVD method or the like. In case where the layer is formed according to a reactive sputtering method or a CVD method, preferably, introduction of a reactive gas into the second vacuum tank is controlled with a flow rate controller (mass flow controller). Especially in case where a reactive sputtering method is employed, preferably, the plasma process is monitored and the data are fed back to the mass flow controller for fine adjustment of the flow rate to thereby stabilize the process. For the feedback, there are known various methods of monitoring the inner pressure, the voltage ad the plasma emission, and any of such methods are employable herein with no specific limitation. The preferred pressure range in the second vacuum chamber before the process is from $10^{-2}$ Pa to $10^{-8}$ Pa, more preferably from $10^{-3}$ Pa to $10^{-8}$ Pa, most preferably from $10^{-4}$ Pa to $10^{-8}$ Pa. In a reactive sputtering method, the preferred pressure range in the second vacuum chamber during the process is from 10 Pa to $10^{-2}$ Pa, more preferably from 1 Pa to $10^{-2}$ Pa, most preferably from $10^{-1}$ Pa to $10^{-2}$ Pa. In a CVD method, the preferred range is from $10^3$ Pa to $10^{-1}$ Pa, more preferably from $10^2$ Pa to $10^0$ Pa.

The inorganic layer is generally a layer of a thin film of a metal compound. The ingredient of the inorganic layer is not specifically defined. For example, in case where a reactive sputtering method is employed for forming the layer, the layer may be formed of an oxide, a nitride, an oxinitride, a carbide or an oxicarbide of at least one metal selected from Si, Al, In, Sn, Zn, Ti, Cu, Ce, Ta and the like. Of those, preferred is an oxide, a nitride or an oxinitride of a metal selected from Si, Al, In, Sn, Zn and Ti; and more preferred is a metal oxide, nitride or oxinitride with Si or Al. These may contain any other element as a secondary ingredient. In a CVD method, preferred is a metal oxide, nitride, carbide or their composite with Si, and more preferred is a metal oxide, nitride or oxinitride with Si. The thickness of the inorganic layer to be formed is not specifically defined. In general, the thickness of one inorganic layer may be within a range of from 5 to 300 nm. The thickness of the inorganic layer is preferably from 20 to 200 nm, more preferably from 30 to 90 nm.

After an inorganic layer is formed in the second vacuum tank, the second vacuum tank may be opened, and under an atmospheric pressure, the support may be transported out, or may be transported further into a third vacuum tank kept in vacuum. In the third vacuum tank, another inorganic layer or organic layer may be formed on the support, or after the tank is opened, the support-may be transported out under an atmospheric pressure. In case where the third vacuum tank is not opened, the support may be further transported into a fourth vacuum tank and a fifth vacuum tank, in which the support may under go the necessary treatment. The third and the later vacuum tanks as referred to herein may be just the above-mentioned first vacuum tank itself, or the fourth and the later vacuum tanks may be just the above-mentioned second vacuum tank itself.

The embodiment of using plural vacuum tanks is generalized as follows: The step of transporting the support from the m'th vacuum tank to the (m+1)'th vacuum tank while kept under the vacuum condition is carried out in order until m reaches n (n is an integer of 2 or more) starting from 1. In this, the m'th vacuum tank and the (m+1)'th vacuum may be connected directly to each other, or via a vacuum chamber disposed between them.

Concretely, there is mentioned an embodiment in which the m'th vacuum tank and the (m+1)'th vacuum are directly connected to each other everywhere in the process. For example, employable is an apparatus where a first vacuum tank 1, a second vacuum tank 2 and a third vacuum tank 3 are connected to each other in series, as in FIG. 1. In this, a support 15 is first transported into the first vacuum tank 1 via a gate valve 4 kept open, then the gate valves 4 and 5 are closed and the tank 1 is degassed via the exhaust port 8 whereby the tank is kept in vacuum. Next, the gate valve 5 is opened and the support 15 is transported into the second vacuum tank 2, and the gate valves 5 and 6 are closed. In that condition, a starting material gas is fed into the tank 2 via the starting material feeding port 11, and an inorganic layer is formed on the support 15 according to a sputtering method. Then, the gate valve 6 is opened and the support 15 is transported into the third vacuum tank 3, and the gate valve 6 is closed. Next, the gate valve 7 is opened to produce an atmospheric pressure condition, and the support with the inorganic layer formed thereon is transported. out through the gate valve 7.

Another preferred embodiment is mentioned, in which n's vacuum tanks all communicate with one vacuum chamber, and when a support is transported between the vacuum tanks, it passes though the vacuum chamber by all means. For example, employable is an apparatus where a first vacuum tank 21, a second vacuum tank 22 and a third vacuum tank 23 are so disposed that they may communicate with each other in parallel via a vacuum chamber 24, as in FIG. 2. In this, a support 15 is first transported into the first vacuum tank 21 via a gate valve 25 kept open, then the gate valves 25 and 26 are closed and the tank 21 is degassed via the exhaust port 31 whereby the tank is kept in vacuum. Next, the gate valve 26 is opened and the support 15 is transported into the second vacuum tank 22 via the vacuum chamber 24, and the gate valve 27 is closed. In that condition, a starting material gas is fed into the tank 22 via the starting material feeding port 35, and an inorganic layer is formed on the support 15 according to a sputtering method. Then, the gate valve 27 is opened and the support 15 is transported into the third vacuum tank 23 via the vacuum chamber 24, and the gate valve 28 is closed. Next, the gate valve 29 is opened to produce an atmospheric pressure condition, and the support with the inorganic layer formed thereon is transported out through the gate valve 29.

Figure 2:
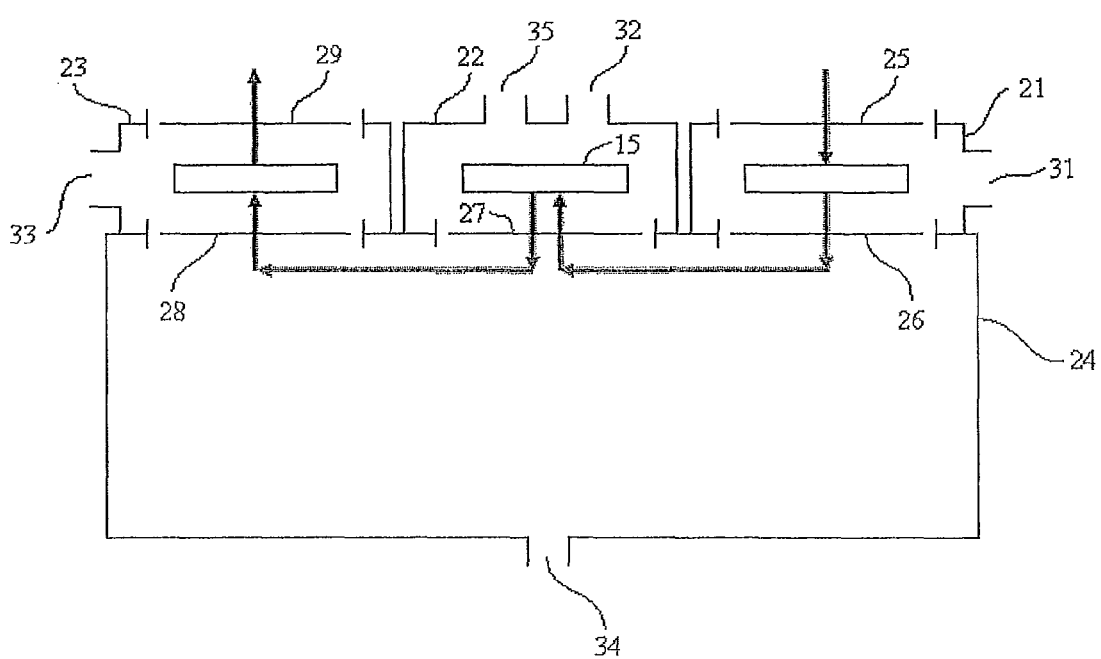
FIG. 2 is an outline view showing another constitution example of a vacuum film formation apparatus for use in the invention.
Figure 3:
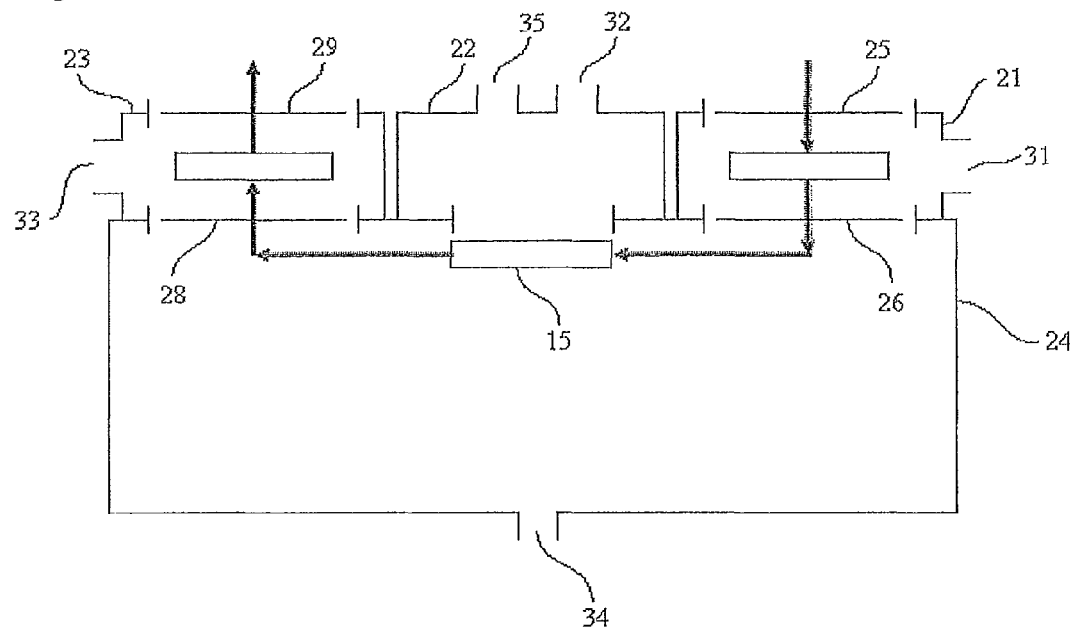
FIG. 3 is an outline view showing still another constitution example of a vacuum film formation apparatus for use in the invention.

The second and the later vacuum tanks may not be completely closed, and may be opened to the other vacuum tanks via a space through which the necessary inner pressure can be kept in each process. Concretely, the gate valve 27 in FIG. 2 is omitted and the support 15 serves to close the second vacuum tank 22, as in FIG. 3. In this, the support 15 and the second vacuum tank may have some space therebetween so as to keep the necessary inner pressure for the process. Alternatively, a holding transporter (not shown) for holding and transporting the support 15 may be provided to close the second vacuum tank 22, or some space may be made between the holding transporter and the second vacuum tank so as to keep the necessary inner pressure for the process.

In the invention, after an organic layer is formed on the inorganic layer, an additional inorganic layer may be formed on the organic layer. Further, alternate lamination of organic layers and inorganic layers may be made to form plural inorganic layers. In such cases, the constitutive inorganic layers may have the same composition or may have different compositions. In addition, an additional inorganic layer may be formed on the support according to any other method than the vacuum film formation method of the invention.

<Barrier Laminate>
(Basic Constitution)

A barrier laminate can be produced by the vacuum film formation method of the invention for an inorganic layer. The barrier laminate of the invention has at least one inorganic layer on a support, and the other constitution thereof is not specifically defined. In this, it is desirable that an inorganic layer is formed on an organic layer which is formed on a support. The number of the organic layers and the inorganic layers, if any, is not specifically defined. Preferably, the barrier laminate of the invention has from 2 to 30, more preferably from 3 to 20 organic layers and inorganic layers. The organic layer and the inorganic layer may be formed on one face or both faces of the support. The organic layer and the inorganic layer may be formed on one face of the support, and any other organic layer and/or inorganic layer not satisfying the requirements of the invention may be formed on the other face thereof. This embodiment is also within the scope of the invention.

In addition to the organic layer and the inorganic layer, any other layer may be formed on the support of the barrier laminate of the invention. The other layer may be a functional layer. The functional layer is described in detail in JP-A 2006-289627, paragraphs [0036] to [0038]. Examples of the additional functional layer are an electroconductive layer, a matting amget layer, a protective layer, a solvent-resistant layer, an antistatic layer, a planarizing layer, an adhesiveness-enhancing layer, a light-shielding layer, an antireflection layer, a hard coat layer, a stress relaxation layer, an antifogging layer, an antisoiling layer, a printable layer, an easy adhesive layer, etc. The functional layer may be formed on a barrier layer that comprises at least one organic layer and at least one inorganic layer, or between the barrier layer and the support, or on the other face of the support not coated with an organic layer and an inorganic layer.

(Property of Barrier Laminate)

The barrier laminate of the invention is characterized by having a low water vapor permeability. The water vapor permeability of the barrier laminate of the invention is, as measured in an environment at 40° C. and a relative humidity of 90%, generally at most 0.01 g/m$^2$/day per one inorganic layer, preferably at most 0.005 g/m²/day, more preferably at most 0.003 g/m²/day, even more preferably at most 0.001 g/m²/day.

(Use of Barrier Laminate)

The barrier laminate of the invention can be used as a substrate for articles that require a gas-barrier property. For example, it is useful as a substrate for devices and optical components. In addition, the barrier laminate of the invention may also be used for sealing devices or optical components that require a gas-barrier property. These are described in detail hereinunder.

<Device>

The barrier laminate of the invention is favorably used for devices of which the performance may readily be deteriorated by chemical ingredients in air (e.g., oxygen, water, nitrogen oxides, sulfur oxides, ozone). Examples of the devices are electronic devices such as organic EL devices, liquid-crystal display devices, thin-film transistors, touch panels, electronic papers, solar cells, etc. Of those, preferred are organic EL devices.

The barrier laminate of the invention may also be used for film sealing of devices. Specifically, at least one organic layer and at least one inorganic layer may be formed on the surface of a device that serves as a support, as described in the above, whereby the device can be sealed with the laminate of the thus-formed layers.

Before the organic layer and the inorganic layer are formed, the device may be covered with a protective layer. An adhesive layer may be formed on the protective layer, and then an organic layer and an inorganic layer may be formed thereon. Not specifically defined, the adhesive may be a thermosetting epoxy resin or a photocurable acrylate resin.

(Organic EL Device)

Examples of an organic EL device with a barrier laminate are described in detail in JP-A 2007-30387.

(Liquid-Crystal Display Device)

A reflection-type liquid-crystal display device has a constitution of a lower substrate, a reflection electrode, a lower alignment film, a liquid-crystal layer, an upper alignment film, a transparent electrode, an upper substrate, a λ/4 plate and a polarizing film, formed in that order from the bottom. In this, the barrier laminate of the invention may be used as the transparent electrode substrate and the upper substrate. In color displays, it is desirable that a color filter layer is additionally provided between the reflection electrode and the lower alignment film, or between the upper alignment film and the transparent electrode. A transmission-type liquid-crystal display device has a constitution of a backlight, a polarizer, a λ/4 plate, a lower transparent electrode, a lower alignment film, a liquid-crystal layer, an upper alignment film, an upper transparent electrode, an upper substrate, a λ/4 plate and a polarizing film, formed in that order from the bottom. In this, the gas-barrier film of the invention may be used as the upper transparent electrode and the upper substrate. In color displays, it is desirable that a color filter layer is additionally provided between the lower transparent electrode and the lower alignment film, or between the upper alignment film and the transparent electrode. Not specifically defined, the type of the liquid-crystal cell is preferably a TN (twisted nematic) type, an STN (super-twisted nematic) type, a HAN (hybrid aligned nematic) type, a VA (vertically alignment) type, an ECB (electrically controlled birefringence) type, an OCB (optically compensated bend) type, a CPA (continuous pinwheel alignment) type, or an IPS (in-plane switching) type.

(Others)

Other applications of the invention are thin-film transistors as in JP-T 10-512104, touch panels as in JP-A 5-127822, 2002-48913, electronic papers as in JP-A 2000-98326, and solar cells as in Japanese Patent Application No. 7-160334.

<Optical Component>

An example of the optical component that comprises the barrier laminate of the invention is a circular polarizer.

(Circular Polarizer)

Laminating a barrier laminate of the invention with a λ/4 plate and a polarizer gives a circular polarizer. In this case, the components are so laminated that the slow axis of the λ/4 plate could cross the absorption axis of the polarizer at an angle of 45°. The polarizer is preferably stretched in the direction of 45° from the machine direction (MD) thereof; and for example, those described in JP-A 2002-86554 are favorably used.

EXAMPLES

The invention is described more concretely with reference to the following Examples. In the following Examples, the material used, its amount and the ratio, the details of the treatment and the treatment process may be suitably modified or changed. Accordingly, the invention should not be limitatively interpreted by the Examples mentioned below.

Example 1

Production and Evaluation of Barrier Laminate According to Sputtering Method (Production of Support S Coated with Organic Layer)

A mixed solution of a monomer M having a structure mentioned below (20 g), an UV polymerization initiator (Ciba Speciality Chemicals' trade name, Ciba Irgacure 907) (0.6 g) and 2-butanone (190 g) was applied onto a polyethylene naphthalate film (PEN film, Teijin DuPont's trade name Neotex Q65FA) to form a layer having a liquid thickness of 5 μm, using a wire bar. This was dried at room temperature for 2 hours, and then cured through irradiation with UV rays from a high-pressure mercury lamp (total irradiation dose, about 2 J/cm²) in a chamber in which the oxygen concentration was reduced to 0.1% through nitrogen purging, thereby forming an organic layer. A support with an organic layer having a thickness of 1000 nm±50 nm was thus prepared. According to the method, supports S with an organic layer having a different surface area (to be coated with an inorganic layer) were prepared.

Monomer M:

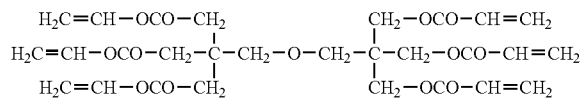

(Production of Barrier Laminate A-1)

The support S with an organic layer having a surface area of 100 cm² was transported into a first vacuum tank having a capacity of 64461.5 cm³, which was then evacuated for 30 minutes. Next, the organic layer-having support S was, not brought into contact with air but kept in vacuum, transported into a second vacuum tank (sputtering chamber). In the second vacuum tank, the support was processed for plasma discharge with Al as the target and with Ar as the discharge gas. While the plasma emission was so monitored as to produce a stoichiometric proportion of $Al_2O_3$, the flow rate of the reaction gas $O_2$ was controlled, and $Al_2O_3$ was formed on the organic layer in a thickness of 30 nm to produce a barrier laminate A-1.

(Production of Barrier Laminate A-2)

The support S with an organic layer having a surface area of 100 cm² was transported into a first vacuum tank having a capacity of 27143.3 cm³, which was then evacuated for 30 minutes. Next, the organic layer-having support S was, not brought into contact with air but kept in vacuum, transported into a second vacuum tank (sputtering chamber). In the second vacuum tank, the support was processed for plasma discharge with Al as the target and with Ar as the discharge gas. While the plasma emission was so monitored as to produce a stoichiometric proportion of $Al_2O_3$, the flow rate of the reaction gas $O_2$ was controlled, and $Al_2O_3$ was formed on the organic layer in a thickness of 30 nm to produce a barrier laminate A-2.

(Production of Barrier Laminate A-3)

The support S with an organic layer having a surface area of 314.1 cm² was transported into a first vacuum tank having a capacity of 8600 cm³, which was then evacuated for 30 minutes. Next, the organic layer-having support S was, riot brought into contact with air but kept in vacuum, transported into a second vacuum tank (sputtering chamber). In the second vacuum tank, the support was processed for plasma discharge with Al as the target and with Ar as the discharge gas. While the plasma emission was so monitored as to produce a stoichiometric proportion of $Al_2O_3$, the flow rate of the reaction gas $O_2$ was controlled, and $Al_2O_3$ was formed- on the organic layer in a thickness of 30 nm to produce a barrier laminate A-3.

(Production of Barrier Laminate A-4)

The support S with an organic layer having a surface area of 113 cm2 was transported into a first vacuum tank having a capacity of 180 cm³, which was then evacuated for 30 minutes. Next, the organic layer-having support S was, not brought into contact with air but kept in vacuum, transported into a second vacuum tank (sputtering chamber). In the second vacuum tank, the support was processed for plasma discharge with Al as the target and with Ar as the discharge gas. While the plasma emission was so monitored as to produce a stoichiometric proportion of $Al_2O_3$, the flow rate of the reaction gas $O_2$ was controlled, and $Al_2O_3$ was formed on the organic layer in a thickness of 30 nm to produce a barrier laminate A-4.

(Determination of Water Vapor Permeability)

According to the method described in G. NISATO, P. C. P. BOUTEN, P. J. SLIKKERVEER, et al's SID Conference Record of the International Display Research Conference, pp. 1435-1438, the water vapor permeability at 40° C. and at a relative humidity of 90% of the barrier laminates A-1 to A-4 was measured. The results are shown in Table 1. A relationship between the ratio, capacity of the first vacuum tank/area of the support (X/Y), and the water vapor permeability is shown in FIG. 4.

TABLE 1

| Barrier Laminate | Capacity X of First Vacuum Tank (cm³) | Surface Y of Support (cm²) | X/Y | Water Vapor Permeability (g/m²/day) | Remarks |
|---|---|---|---|---|---|
| A-1 | 64461.6 | 100 | 644.6 | 0.018 | Comparative Example |
| A-2 | 27143.4 | 100 | 271.4 | 0.015 | Comparative Example |
| A-3 | 8600 | 314.2 | 27.4 | 0.0032 | the Invention |
| A-4 | 180 | 113.1 | 1.6 | 0.0008 | the Invention |

Figure 4:
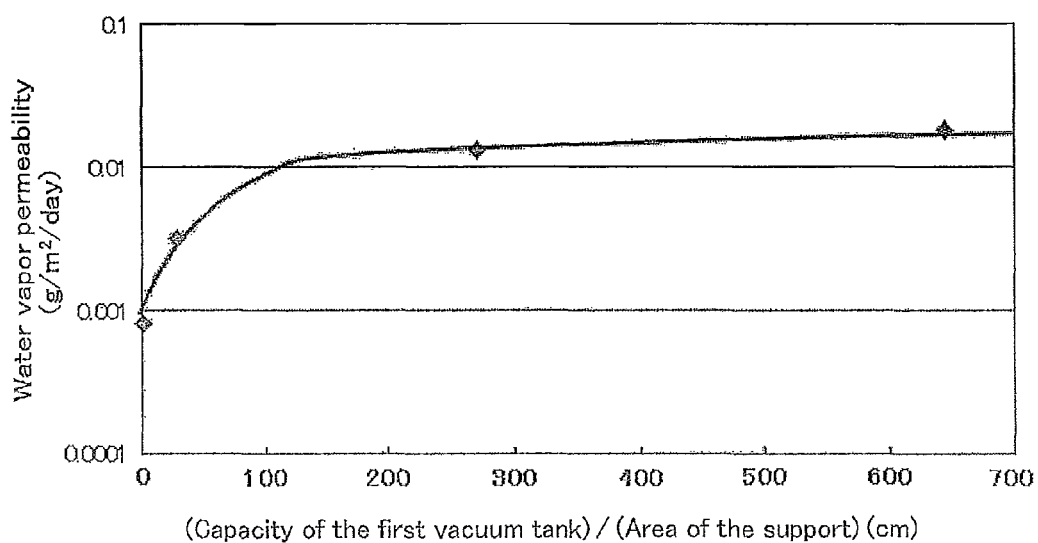
FIG. 4 is a graph showing a relationship between the ratio, capacity of the first vacuum tank/area of the support (X/Y), and the water vapor permeability.

As is obvious from FIG. 4, it is known that, when the ratio of the capacity X of the first vacuum tank to the area Y of the support (X/Y) is not larger than 100, then the water vapor permeability per one inorganic layer can be smaller than 0.011 g/m²/day that is the best value in the above-mentioned JP-A 2002-264274, and the water vapor permeability through the laminate significantly reduces. When the ratio of the capacity X of the first vacuum tank to the area Y of the support (X/Y) is not larger than 30, then the water vapor permeability reduces further more, and when it is not larger than 10, the water vapor permeability is extremely small.

Example 2

Production and Evaluation of Barrier Laminate According to Sputtering Method (Production of Barrier Laminate B-1)

The support S with an organic layer having a surface area of 64461.5 cm² was transported into a first vacuum tank having a capacity of 100 cm³, which was then evacuated for 30 minutes. Next, the organic layer-having support S was, not brought into contact with air but kept in vacuum, transported into a second vacuum tank (sputtering chamber). In the second vacuum tank, the support was processed for plasma discharge with Si as the target and with Ar as the discharge gas. While the plasma emission was so monitored as to produce a stoichiometric proportion of $Si_3N_4$, the flow rate of the reaction gas $N_2$ was controlled, and $Si_3N_4$ was formed on the organic layer in a thickness of 30 nm to produce a barrier laminate B-1.

(Production of Barrier Laminate B-2)

The support S with an organic layer having a surface area of 27143.3 cm² was transported into a first vacuum tank having a capacity of 100 cm³, which was then evacuated for 30 minutes. Next, the organic layer-having-support S was, not brought into contact with air but kept in vacuum, transported into a second vacuum tank (sputtering chamber). In the second vacuum tank, the support was processed for plasma discharge with Si as the target and with Ar as the discharge gas. While the plasma emission was so monitored as to produce a stoichiometric proportion of $Si_3N_4$, the flow rate of the reaction gas $N_2$ was controlled, and $Si_3N_4$ was formed on the organic layer in a thickness of 30 nm to produce a barrier laminate B-2.

(Production of Barrier Laminate B-3)

The support S with an organic layer having a surface area of 8600 cm² was transported into a first vacuum tank having a capacity of 314.1 cm³, which was then evacuated for 30 minutes. Next, the organic layer-having support S was, not brought into contact with air but kept in vacuum, transported into a second vacuum tank (sputtering chamber). In the second vacuum tank, the support was processed for plasma discharge with Si as the target and with Ar as the discharge gas. While the plasma emission was so monitored as to produce a stoichiometric proportion of $Si_3N_4$, the flow rate of the reaction gas $N_2$ was controlled, and $Si_3N_4$ was formed on the organic layer in a thickness of 30 nm to produce a barrier laminate B-3.

(Production of Barrier Laminate B-4)

The support S with an organic layer having a surface area of 180 cm² was transported into a first vacuum tank having a capacity of 113 cm³, which was then evacuated for 30 minutes. Next, the organic layer-having support S was, not brought into contact with air but kept in vacuum, transported into a second vacuum tank (sputtering chamber). In the second vacuum tank, the support was processed for plasma discharge with Si as the target and with Ar as the discharge gas. While the plasma emission was so monitored as to produce a stoichiometric proportion of $Si_3N_4$, the flow rate of the reaction gas $N_2$ was controlled, and $Si_3N_4$ was formed on the organic layer in a thickness of 30 nm to produce a barrier laminate B-4.

(Determination of Water Vapor Permeability)

The water vapor permeability at 40° C. and at a relative humidity of 90% of the barrier laminates B-1 to B-4 was measured as in Example 1. The results are shown in Table 2.

TABLE 2

| Barrier Laminate | Capacity X of First Vacuum Tank (cm³) | Surface Y of Support (cm²) | X/Y | Water Vapor Permeability (g/m²/day) | Remarks |
|---|---|---|---|---|---|
| B-1 | 64461.6 | 100 | 644.6 | 0.034 | Comparative Example |
| B-2 | 27143.4 | 100 | 271.4 | 0.02 | Comparative Example |
| B-3 | 8600 | 314.2 | 27.4 | 0.0076 | the Invention |
| B-4 | 180 | 113.1 | 1.6 | 0.0034 | the Invention |

As is obvious from Table 2, it is known that, in case where the inorganic layer of $Si_3N_4$ is formed according to the invention, the water vapor permeability per one inorganic layer can be smaller than 0.011 g/m²/day and the water vapor permeability through the laminate significantly reduces, when the ratio of the capacity X of the first vacuum tank to the area Y of the support (X/Y) is not larger than 100, like in the case where an inorganic layer of $Al_2O_3$ is formed (Example 1). When the ratio of the-capacity X of the first vacuum tank to the area Y of the support (X/Y) is not larger than 30, then the water vapor permeability reduces further more, and when it is not larger than 10, the water vapor permeability is extremely small.

Example 3

Production and Evaluation of Barrier Laminate according to CVD Method (Production of Barrier Laminate C-1)

The support S with an organic layer having a surface area of 400 cm² was transported into a first vacuum tank having a capacity of 72000 cm³, which was then evacuated for 30 minutes. Next, the organic layer-having support S was, not brought into contact with air but kept in vacuum, transported into a second vacuum tank (CVD chamber). In the second vacuum tank, silane gas ($SiH_4$), ammonia gas ($NH_3$) and nitrogen gas ($N_2$) were introduced. With an RF discharge power at a frequency of 13.56 MHz applied thereto, a layer of $Si_3N_4$ having a thickness of 100 nm was formed on the support at a temperature of 25° C. and a film formation pressure of 10 Pa, thereby producing a barrier laminate C-1.

(Production of Barrier Laminate C-2)

The support S with an organic layer having a surface area of 314.2 cm² was transported into a first vacuum tank having a capacity of 8600 cm³, which was then evacuated for 30 minutes. Next, the organic layer-having support S was, not brought into contact with air but kept in vacuum, transported into a second vacuum tank (CVD chamber). In the second vacuum tank, silane gas ($SiH_4$), ammonia gas ($NH_3$) and nitrogen gas ($N_2$) were introduced. With an RF discharge power at a frequency of 13.56 MHz applied thereto, a layer of $Si_3N_4$ having a thickness of 100 nm was formed on the support at a temperature of 25° C. and a film formation pressure of 10 Pa, thereby producing a barrier laminate C-2.

(Production of Barrier Laminate C-3)

The support S with an organic layer having a surface area of 113.1 cm² was transported into a first vacuum tank having a capacity of 180 cm³, which was then evacuated for 30 minutes. Next, the organic layer-having support S was, not brought into contact with air but kept in vacuum, transported into a second vacuum tank (CVD chamber). In the second vacuum tank, silane gas ($SiH_4$), ammonia gas ($NH_3$) and nitrogen gas ($N_2$) were introduced. With an RF discharge power at a frequency of 13.56 MHz applied thereto, a layer of $Si_3N_4$ having a thickness of 100 nm was formed on the support at a temperature of 25° C. and a film formation pressure of 10 Pa, thereby producing a barrier laminate C-3.

(Determination of Water Vapor Permeability)

The water vapor permeability at 40° C. and at a relative humidity of 90% of the barrier laminates C-1 to C-3 was measured as in Example 1. The results are shown in Table 3.

TABLE 3

| Barrier Laminate | Capacity X of First Vacuum Tank (cm³) | Surface Y of Support (cm²) | X/Y | Water Vapor Permeability (g/m²/day) | Remarks |
|---|---|---|---|---|---|
| C-1 | 72000 | 400 | 180 | 0.023 | Comparative Example |
| C-2 | 8600 | 314.2 | 27.4 | 0.0092 | the Invention |
| C-3 | 180 | 113.1 | 1.6 | 0.0061 | the Invention |

As is obvious from Table 3, it is known that, in case where the inorganic layer of $Si_3N_4$ is formed according to the CVD method of the invention, the water vapor permeability per one inorganic layer can be smaller than 0.011 g/m²/day and the water vapor permeability through the laminate significantly reduces, when the ratio of the capacity X of the first vacuum tank to the area Y of the support (X/Y) is not larger than 100, like in the case where an inorganic layer of $Al_2O_3$ (Example 1) or $Si_3N_4$ (Example 2) is formed according to a sputtering method. When the ratio of the capacity X of the first vacuum tank to the area Y of the support (X/Y) is not larger than 30, then the water vapor permeability reduces further more, and when it is not larger than 10, the water vapor permeability is extremely small.

Example 4

Production and Evaluation of Organic EL Device:

(Production of Barrier Laminate D-1)

The step of film formation of an organic layer as described in (Production of Support S Coated with Organic Layer) in Example 1, and the step of film formation of an inorganic layer as described in (Production of Barrier Laminate A-4) in Example 1 were repeated to form an organic layer, an $Al_2O_3$ layer, an organic layer, an $Al_2O_3$ layer, an organic layer and an $Al_2O_3$ layer in that order on a support of polyethylene naphthalate, thereby producing a barrier laminate D-1.

(Production of Organic EL Device)

An ITO film-coated conductive glass substrate (surface resistivity, 10 Ω/square) was washed with 2-propanol, and then subjected to UV-ozone treatment for 10 minutes. On this substrate (anode), the following organic compound layers were deposited in order according to a vapor deposition method.

| First Hole Transportation Layer: | |
| --- | --- |
| Copper Phthalocyanine | thickness 10 nm |
| Second Hole Transportation Layer: | |
| N,N'-diphenyl-N,N'-dinaphthylbenzidine | thickness 40 nm |
| Light Emission Layer serving also as electron transportation layer: | |
| Tris(8-hydroxyquinolinato)aluminum | thickness 60 nm |

Finally, lithium fluoride was vapor-deposited in a thickness of 1 nm and metal aluminum was in a thickness of 100 nm in that order, serving as a cathode. On this, a silicon nitride film having a thickness of 5 μm was formed according to a parallel plate CVD method, thereby constructing an organic EL device.

(Disposition of Gas-Barrier Laminate on Organic EL Device)

Using a thermosetting adhesive (Daizo-Nichimori's Epotec 310), the barrier laminate D-1 and the above organic EL device substrate were stuck together in such a manner that the inorganic layer of the laminate could be on the side of the organic EL device substrate, and heated at 65° C. for 3 hours to cure the adhesive. In that manner, sealed organic EL devices were produced. 20 sealed samples were produced per one barrier laminate.

(Evaluation of Light-Emitting Surface of Organic EL Device)

Immediately after their production, the organic EL devices were driven for light emission at a voltage of 7V applied thereto, using a source measure unit (Keithley's SMU2400 Model) Using a microscope, the surface of each sample was checked for its condition with light emission, and it was confirmed that all the devices gave uniform light emission with no dark spot.

Next, the devices were kept in a dark room at 60° C. and a relative humidity of 90% for 24 hours, and checked for the surface condition with light emission. The proportion of the samples with dark spots having a diameter of larger than 300 μm is defined as a failure ratio; and the failure ratio of each sample was determined to be less than 1%.

As is obvious above, it is shown that the organic EL devices sealed by the barrier laminate D-1 of the invention is very useful with very low failure ratio.

Example 5

Production and Evaluation of Organic EL Device:

Sealed organic EL device was produced in the same manner as in Example 4, for which, however, the barrier laminate D-1 produced in Example 4 was used. In disposing the gas-barrier laminate on the organic EL device, a UV-curable adhesive (Nagase Ciba's XNR5516HV) was used in place of the thermosetting adhesive, and the adhesive was cured for adhesion through UV irradiation in an argon gas-purged globe box. The samples were evaluated in the same manner as in Example 4, and their data were almost the same as in Example 4.

Example 6

Production of Organic EL Device, using Barrier Laminate as Substrate:

The barrier laminate D-1 produced in Example 4 was introduced into a vacuum chamber; and using an ITO target, a transparent electrode of a thin ITO film having a thickness of 0.2 μm was formed thereon according to DC magnetron sputtering. The ITO film-having barrier laminate was put into a washing tank, ultrasonically washed therein with 2-propanol, and then processed for UV-ozone treatment for 30 minutes. Using the substrate, an organic EL device was produced in the same manner as in Example 4. In the device, both the substrate and the sealing film comprise a resin as the main ingredient, and the device was therefore flexible.

While the present invention has been described in detail and with reference to specific embodiments thereof, it will be apparent to one skilled in the art that various changes and modifications can be made therein without departing from the spirit and scope thereof.

The present disclosure relates to the subject matter contained in Japanese Patent Application No. 67542/2008 filed on Mar. 17, 2008, which is expressly incorporated herein by reference in its entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A vacuum film formation method for forming at least one inorganic layer having a water vapor permeability of smaller than 0.011 g/m$^2$/day on a support, which comprises:
 transporting a support into a first vacuum tank under atmospheric pressure; wherein the area of the surface of the support to be coated with an inorganic layer formed thereon is represented by a, wherein a has a unit of cm$^2$, and the first vacuum tank has a capacity of at most 1.6 a, wherein the vacuum tank capacity has a unit of cm$^3$,
 degassing the first vacuum tank into a vacuum,
 transporting the support from the first vacuum tank to a second vacuum tank while the vacuum condition is kept as such, and forming at least one inorganic layer on the support in the second vacuum tank;

wherein the first vacuum tank and the second vacuum tank directly communicate with each other so that an outlet port of the first vacuum tank is an inlet port of the second vacuum tank.

2. The vacuum film formation method for forming an inorganic layer according to claim 1, wherein the inorganic layer is formed according to a reactive sputtering method.

3. The vacuum film formation method for forming an inorganic layer according to claim 2, wherein the inorganic layer is an $Si_3N_4$ layer or an $Al_2O_3$ layer.

4. The vacuum film formation method for forming an inorganic layer according to claim 1, wherein the support to be transported into the first vacuum tank is a support having an organic layer formed on its surface, and the inorganic layer is formed on the organic layer.

5. The vacuum film formation method for forming an inorganic layer according to claim 1, wherein the support is a plastic film.

6. A vacuum film formation method for forming at least one inorganic layer having a water vapor permeability of smaller than 0.011 $g/m^2/day$ on a support, which comprises:

transporting a support into an m'th vacuum tank under atmospheric pressure; wherein the area of the surface of the support to be coated with an inorganic layer formed thereon is represented by a with a unit of $cm^2$ and the m'th vacuum tank has a capacity of at most 1.6 a, wherein the vacuum tank capacity has a unit of $cm^3$, degassing the m'th vacuum tank into a vacuum, transporting the support from the m'th vacuum tank to an (m+1)'th vacuum tank while the vacuum condition is kept as such, and forming at least one inorganic layer on the support in one or more n'th vacuum tanks;

wherein the step of transporting the support from the m'th vacuum tank to the (m+1)'th vacuum tank while kept under the vacuum condition is carried out in order until m reaches n in which m starts from 1 and n is an integer of 2 or more; and wherein the m'th vacuum tank and the (m+1)'th vacuum tank directly communicate with each other so that an outlet port of the m'th vacuum tank is an inlet port of the (m+1)'th vacuum tank.

7. A method for producing a barrier laminate having an inorganic layer having a water vapor permeability of smaller than 0.011 $g/m^2/day$, which comprises:

transporting a support into a first vacuum tank under atmospheric pressure; wherein the area of the surface of the support to be coated with an inorganic layer formed thereon is represented by a with a unit of $cm^2$ and the first vacuum tank has a capacity of at most 1.6 a, wherein the vacuum tank capacity has a unit of $cm^3$, degassing the first vacuum tank into a vacuum, transporting the support from the first vacuum tank to a second vacuum tank while the vacuum condition is kept as such, and forming at least one inorganic layer on the support in the second vacuum tank;

wherein the first vacuum tank and the second vacuum tank directly communicate with each other so that an outlet port of the first vacuum tank is an inlet port of the second vacuum tank.

8. The method according to claim 7, wherein the inorganic layer is formed according to a reactive sputtering method.

9. The method according to claim 8, wherein the inorganic layer is an $Si_3N_4$ layer or an $Al_2O_3$ layer.

10. The method according to claim 7, wherein the support is a plastic film.

11. The method according to claim 7, wherein the support to be transported into the first vacuum tank is a support having an organic layer formed on its surface, and the inorganic layer is formed on the organic layer.

12. A method for producing a barrier laminate having an inorganic layer having a water vapor permeability of smaller than 0.011 $g/m^2/day$, which comprises:

transporting a support into an m'th vacuum tank under atmospheric pressure; wherein the area of the surface of the support to be coated with an inorganic layer formed thereon is represented by a with a unit of $cm^2$ and the m'th vacuum tank has a capacity of at most 1.6 a, wherein the vacuum tank capacity has a unit of $cm^3$, degassing the m'th vacuum tank into a vacuum, transporting the support from the m'th vacuum tank to an (m+1)'th vacuum tank while the vacuum condition is kept as such, and forming at least one inorganic layer on the support in one or more n'th vacuum tanks;

wherein the step of transporting the support from the m'th vacuum tank to the (m+1)'th vacuum tank while kept under the vacuum condition is carried out in order until m reaches n in which m starts from 1 and n is an integer of 2 or more; and wherein the m'th vacuum tank and the (m+1)'th vacuum tank directly communicate with each other so that an outlet port of the m'th vacuum tank is an inlet port of the (m+1)'th vacuum tank.

13. The method according to claim 12, wherein the n'th vacuum tanks all communicate with one vacuum chamber, and when the support is transported between the vacuum tanks, the support passes though the vacuum chamber by all means.

\* \* \* \* \*